(12) United States Patent
Bernstein (10) Patent No.: US 6,597,173 B1
(45) Date of Patent: Jul. 22, 2003

(54) METHOD AND APPARATUS FOR RECONSTRUCTING ZOOM MR IMAGES

(75) Inventor: Tsur Bernstein, Glendale, WI (US)

(73) Assignee: GE Medical Systems Global Technology Co., LLC, Waukesha, WI (US)

( * ) Notice: Subject to any disclaimer, the term of this patent is extended or adjusted under 35 U.S.C. 154(b) by 0 days.

(21) Appl. No.: 10/064,406

(22) Filed: Jul. 10, 2002

(51) Int. Cl.[7] .................................................. G01V 3/00
(52) U.S. Cl. ........................................ 324/318; 324/322
(58) Field of Search ................................ 324/309, 307, 324/306, 318, 322, 314, 300

(56) References Cited

U.S. PATENT DOCUMENTS

6,253,101 B1   6/2001   Seng et al.
6,323,648 B1   11/2001  Belt et al.

Primary Examiner—Louis Arana
(74) Attorney, Agent, or Firm—Ziolkowski Patent Solutions Group, LLC; Michael A. Della Penna; Carl B. Horton (57) ABSTRACT

The present invention relates generally to MR imaging and, more particularly, to a method and apparatus for reconstructing zoom MR images. An RF coil assembly having a number of detection elements is provided. The RF coil assembly is designed such that the number of detection elements that may be used to acquire imaging data may exceed the number of data acquisition channels of the MR system. Accordingly, the detection elements may be grouped into a number of sets wherein each set transmits acquired data to a specific data acquisition channel to acquire data of a larger region-of-interest (ROI) or, alternately, only one set of detection elements corresponding to a smaller ROI may be activated wherein each detection element of the set transmits data to a data acquisition channel. As a result, a zoom image may be reconstructed.

28 Claims, 6 Drawing Sheets

METHOD AND APPARATUS FOR RECONSTRUCTING ZOOM MR IMAGES

BACKGROUND OF INVENTION

The present invention relates generally to MR imaging and, more particularly, to a method and apparatus for reconstructing panoramic and/or zoom MR images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received by an RF coil assembly and subsequently processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Typically, the RF coil chosen for a particular clinical application is selected as a function of the anatomy to be imaged in a field-of-view (FOV) or volume-of-interest (VOI). Often, a large FOV/VOI image is first acquired of the subject and then the user or technician then identifies a smaller region on the image for which an image of higher resolution or zoom is sought. For example, the larger FOV/VOI image may be acquired with a phased array coil having four coils or detection elements. To acquire data for an image with higher resolution of a smaller region or FOV/VOI, a different phased array coil consisting of four smaller coils is positioned and activated to acquire data for the higher resolution image of the specific FOV/VOI. This procedure can be cumbersome for the user and may be uncomfortable for the patient.

It would therefore be desirable to have a system and method capable of acquiring a large FOV/VOI image as well as acquiring data for an image with higher resolution of a smaller FOV/VOI without having to physically change coils on the patient.

BRIEF DESCRIPTION OF INVENTION

The present invention solves the aforementioned problems and provides a system and method of reconstructing panoramic and/or zoom MR images. An RF coil assembly having a number of detection elements is provided. The RF coil assembly is designed such that the number of detection elements exceeds the number of data acquisition channels of the MR system. Accordingly, the detection elements may be grouped into a number of sets wherein each set transmits acquired data to a specific data acquisition channel or, alternately, only one set of detection elements may be activated wherein each detection element of the set transmits data to a data acquisition channel. As a result, a panoramic and/or zoom image may be reconstructed.

Therefore, in accordance with one aspect of the present invention, an RF coil assembly of an MRI system having plural data acquisition channels is provided. The RF coil assembly includes plurality of detection elements and a control to activate a given number of detection elements from the plurality of detection elements to acquire data of a first ROI, wherein the given number of detection elements exceeds the number of data acquisition channels of the MRI system. The control is further configured to transfer the data from the given number of detection elements across the number of data acquisition channels.

In accordance with yet a further aspect of the present invention, a method of MR imaging a subject includes the step of positioning the subject to be scanned in an imaging bay of an MR system having an RF coil assembly and a number of data acquisition channels. The RF coil assembly has a plurality of detection elements exceeding the number of data acquisition channels of the MR system. The method further includes the step of activating a specific number of detection elements in an RF coil assembly to acquire imaging data from a first ROI and reconstructing an image of the first ROI. A second ROI within the first ROI is identified from the image of the first ROI and fewer than the specific number of detection elements in the RF coil assembly are activated to acquire imaging data from the second ROI.

In accordance with another aspect of the present invention, an MRI apparatus includes a plurality of gradient coils positioned about a bore of a magnet to impress a polarizing magnetic field. The apparatus also includes an RF transceiver system and an RF coil assembly to acquire MR images. The RF coil assembly includes a number of detection elements. The MRI apparatus further includes a number of data acquisition channels connected to the number of detection elements wherein the number of detection elements used to acquire imaging data is capable of exceeding the number of data acquisition channels.

In accordance with yet another aspect of the present invention, a computer readable storage medium having stored thereon a computer program to effectuate image reconstruction is provided. The computer program has a set of instructions that when executed by a computer causes the computer to initiate acquisition of MR data for a first ROI of the subject. The computer is then caused to receive MR data for the first ROI from a number of data acquisition channels of an MRI system. The MR system includes an RF coil assembly having a plurality of RF detection elements wherein the plurality of RF detection elements exceeds the number of data acquisition channels. The computer is then caused to reconstruct an image of the first ROI. A user input identifying a second ROI within the first ROI is received and fewer detection elements than used to acquire MR data of the first ROI are activated so as to acquire MR data of the second ROI using an identical RF coil assembly used to acquire the MR data of the first ROI.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
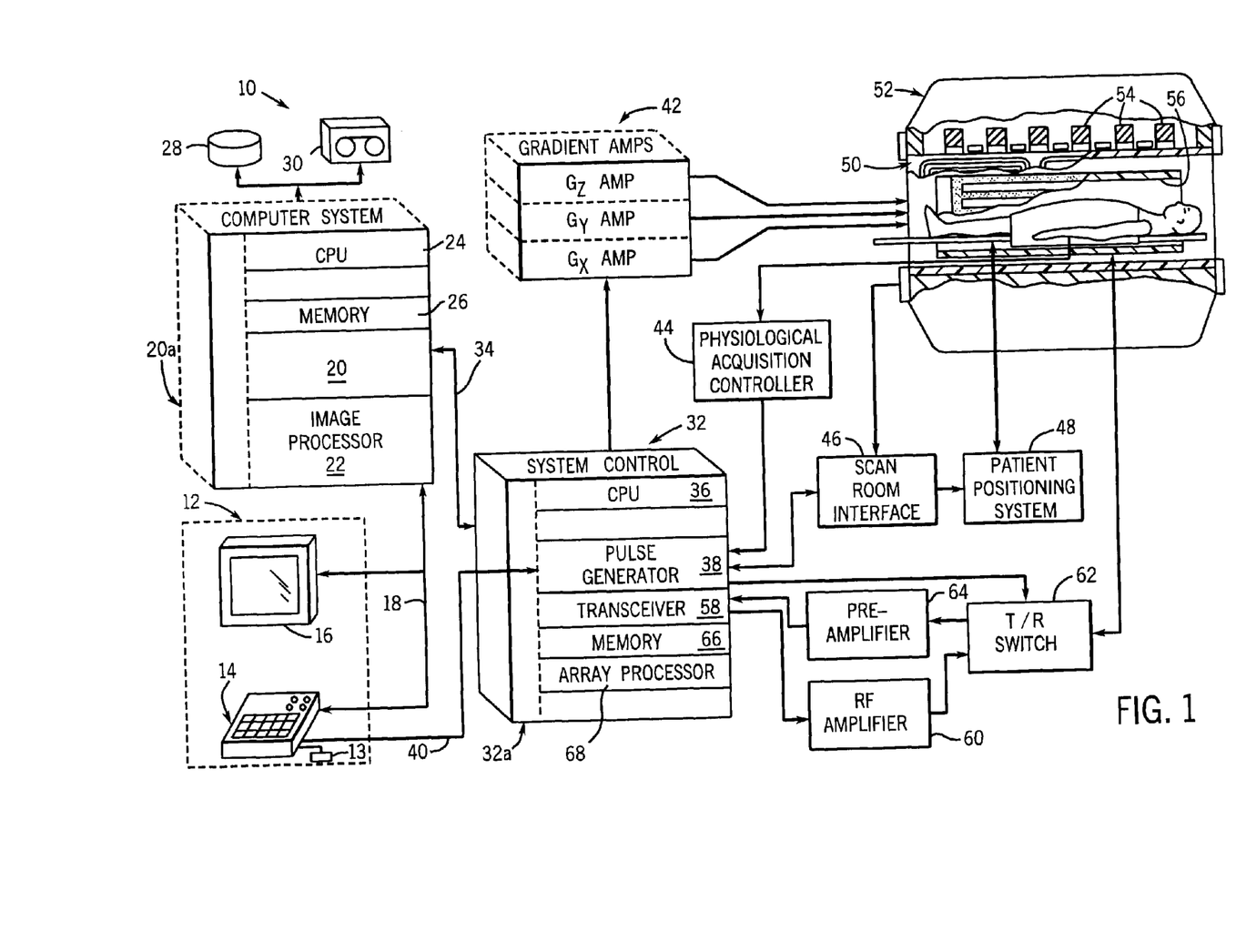
FIG. 1 is a schematic block diagram of an MR imaging system for use with the present invention.

Referring to FIG. 1, a system is shown to acquire diagnostic data of a region-of-interest (ROI) such as a field-of-view (FOV) or volume-of-interest (VOI) of a subject and reconstruct MR images, including panoramic and zoom images, from the acquired diagnostic data. The present invention will be particularly described with respect to a spinal RF coil array, but the present invention may be equivalently applied with respect to other RF coil assemblies, such as head coils, thorax coils, full body coils, and the like.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

As indicated previously, the present invention will be particularly described with respect to a spinal RF coil array, but is equivalently applicable to other RF coil assemblies. For example, whole body coils and head coils are just two more examples of coils that can be constructed and implemented in accordance with the present invention.

Figure 2:
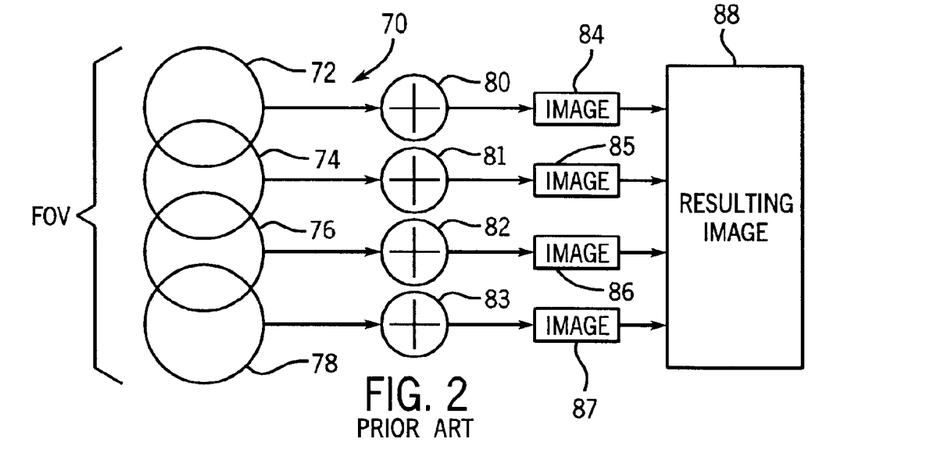
FIG. 2 is a schematic representation of a spinal RF coil array.

Referring now to FIG. 2, a schematic representation of a prior art spinal RF coil array 70 is illustrated. The spinal RF coil array 70 is a surface coil used to acquire imaging data for an FOV and includes four separate detection elements 72–78 that collectively corresponds to an FOV of the coil assembly 70. In this example, the FOV for RF coil assembly 70 corresponds to at least a portion of the spinal region of a subject to be scanned. This known FOV refers to the FOV resulting from the activation of detection elements equal in number to the number of data acquisition channels of the MR system. That is, each data acquisition channel is active and connected to a single detection element. Each detection element 72–78 detects change in excited nuclei of the subject and transmits signals indicative of that which is detected to separate data acquisition channels 80–83, respectively. As indicated previously, a disadvantage of an RF coil similar to RF coil assembly 70 is that it is difficult to reconstruct an image with improved image resolution of an FOV smaller than the FOV of the coil assembly. As a result, it is often necessary to replace RF coil assembly 70 with another coil assembly to acquire data within a smaller FOV or for each clinical application. The data received by each channel 80–83 is then used to reconstruct an independent image 84–87, respectively. The independent images 84–87 are then combined to form a single resulting image 88 using known summation techniques.

Notwithstanding the aforementioned disadvantages, coil array 70 having multiple detection elements has several advantages over a large single detection element coil. By using four smaller detection elements, each detection element has a smaller FOV. Additionally, the noise associated with each detection element is less since the tissue seen by each detection element is smaller. That is, a large single detection element coil has a larger FOV and therefore more noise. By taking the signals from each detection element and passing it through its own D/A converter and reconstructing multiple images, each image associated with each detection element has an SNR that is better than may be achieved by a large single detection element coil or by simply summing the signals from each detecting element. These four high SNR images are then combined using the square root of the sum of the squares method into an image that subtends the larger FOV. The increased SNR may be used to improve spatial resolution, in a given acquisition time, may be used to shorten the acquisition time, or to produce a less noisy image.

Figure 3:
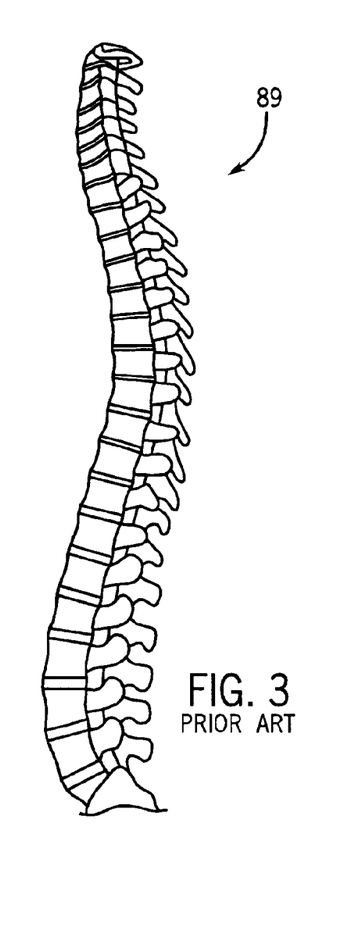
FIG. 3 is a visual representation of an image acquired with the spinal RF coil array shown schematically in FIG. 2.

Referring now to FIG. 3, a visual representation of a typical MR image 89 reconstructed from data acquired by an RF coil assembly similar to that shown in FIG. 2 is illustrated. To pan in and reconstruct an image of a portion of image 89 it would be, as indicated previously, necessary to reacquire imaging data with a separate RF coil assembly having smaller detection elements so that data may be acquired using detection elements more sensitive to a particular FOV or ROI.

Figure 4:
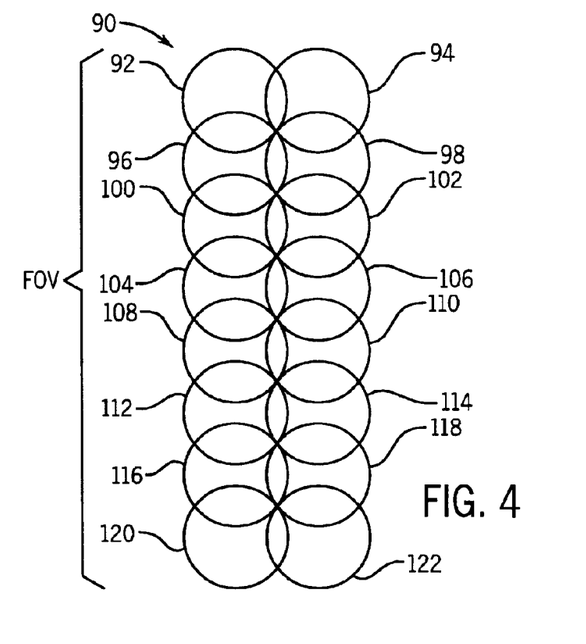
FIG. 4 is a schematic representation of a sixteen spinal coil array in accordance with the present invention.

FIG. 4 is a schematic representation of a spinal RF coil array in accordance with the present invention. RF coil array 90 is a surface coil array and, in this embodiment, includes sixteen separate and distinct detection elements 92–122. The FOV associated collectively with RF coil 90 is equal to the FOV of coil assembly 70 of FIG. 2. However, the FOV associated with each detection element 92–122 is smaller than the FOV corresponding to each detection element 72–78 of coil 70, FIG. 2. As such, as will be discussed in greater detail below, each detection coil 92–122 may be independently activated to acquire imaging data of an FOV smaller than the collective FOV associated with detection elements 72–78 of coil assembly 70, FIG. 2.

For MRI systems that implement four data acquisition channels, RF coil assembly 90 is designed such that the individual detection elements 92–122 may be grouped together in four sets wherein the number of sets equals the number of data acquisition channels 124–130 of the MRI system. That is, in the example illustrated in FIG. 5, detection elements 92–98 are grouped together in a single set such that the electrical signals transmitted by each coil are transmitted to and added together in the same data acquisition channel 124. Detection elements 100–106 are grouped into a single set and transmit data to data channel 126. Detection elements 108–114 are likewise grouped into a set and transmit electrical signals to data acquisition channel 128. Detection elements 116–122 are likewise grouped into a set and transmit electrical signals to data acquisition 130. Generally, detection elements 92–122 may be grouped into sets equal in number to the number of data acquisition channels. As such, the number of activated detection elements exceeds the number of data acquisition channels. Typically, this grouping or summing of signals from multiple detection elements is not desired, but by grouping the detection elements such that the number of groups equal the number of data set channels, data for the larger collective FOV may be acquired using the same coil array used to acquire data of a smaller FOV.

Figure 5:
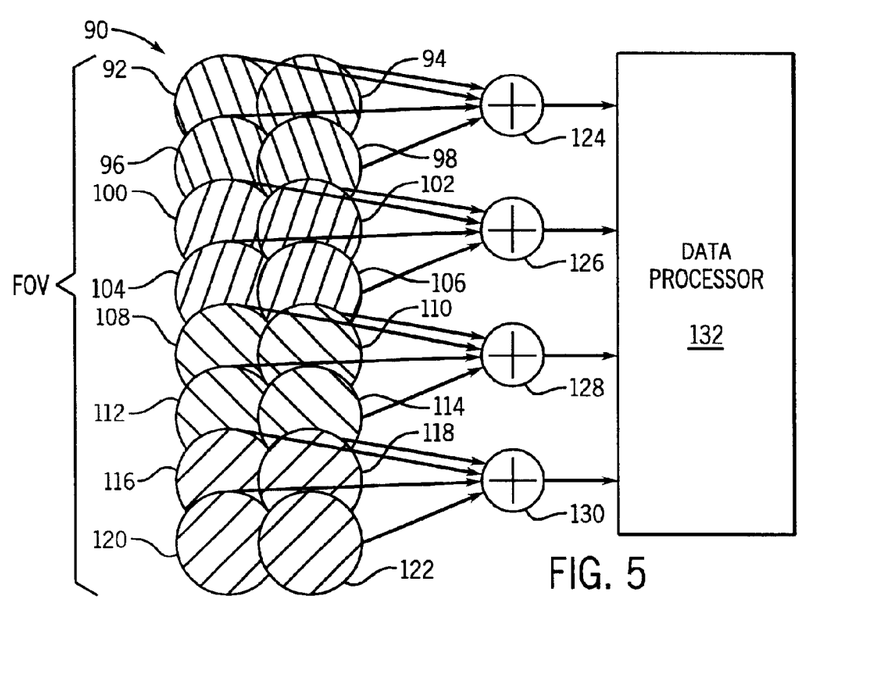
FIG. 5 is a schematic representation of the sixteen spinal coil array shown in FIG. 4 in accordance with the present invention.

Still referring to FIG. 5, each data acquisition channel 124–130 then inputs the data to a data processor 132 for subsequent processing and image reconstruction in accordance with known imaging techniques. It is noted that the FOV associated with each set is approximately equal to the combined FOVs of each detection element. That is, the FOV of set comprising elements 92–98 is approximately equal to the FOV resulting from the sum of the FOV of element 92, the FOV of element 94, the FOV of element 96, and the FOV of element 98. Because there is a degree of overlap between detection elements, the FOV of the detection element sets is slightly less than the combined sum of the FOVs of each element within the set.

When each detection element 92–122 of coil assembly 90 is activated, an image similar to image 89 of FIG. 3 is generated. However, because RF coil assembly 90 includes a plurality of smaller detection elements 92–122, it is possible to acquire imaging data specific to a smaller FOV than the FOV of the coil assembly with the same coil assembly and thereby reconstruct a zoom image.

Figure 6:
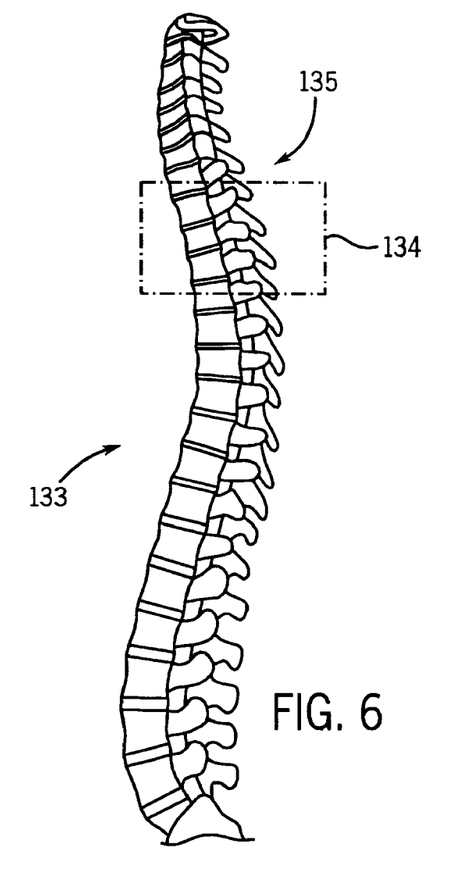
FIG. 6 is a visual representation similar to that shown in FIG. 3 with a user placed marker to identify a specific region of interest in accordance with the present invention.

Referring now to FIG. 6, a visual representation similar to that shown in FIG. 3 is shown having a cursor or marker box 134 superimposed over a particular section of interest of image 133. That is, an image 133 corresponding to the entire FOV of the coil assembly 90 may be displayed on a graphical user interface so that a user may place a cursor such as marker box 134 over a particular ROI 135 identifying a portion of the image in which an image with higher resolution is desired. For example, the user may position marker box 134 over ROI 135 such that data is acquired limited only to that ROI such that a reconstructed image such as a zoomed image with higher resolution may be reconstructed. Alternately, a diagram of the coil assembly 90 may be superimposed over the reconstructed image 133 thereby allowing the user to select those detection elements 92–122 to activate for image reconstruction. As a result, the user may direct the MRI system to reconstruct an image with data from non-adjacent detection elements to generate a panoramic image as will be described with respect to FIG. 9.

Figure 7:
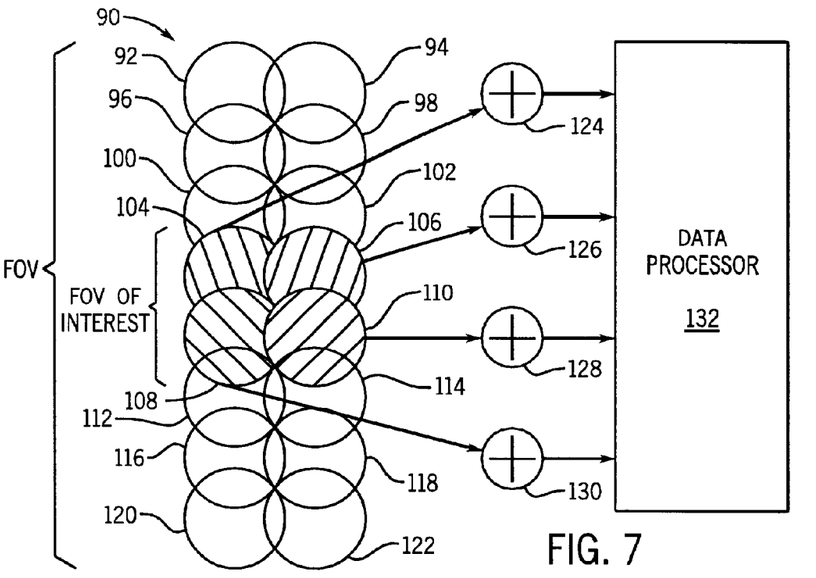
FIG. 7 is a schematic representation of a sixteen spinal coil array similar to that shown in FIG. 4 to acquire imaging data of the user defined specific region of interest illustrated in FIG. 6.

Referring now to FIG. 7, schematic representation of coil assembly 90 is shown wherein a set of the detection elements are activated by a control (FIG. 1) to acquire imaging data from the FOV corresponding to the ROI 135 identified by the user in placement of marker box 134 as shown and described with respect to FIG. 6. In this example, detection elements 104–110 represent the detection elements most sensitive to the ROI 135. As such, each detection element is activated by a controller or a computer in the MRI system in accordance with a computer program or set of instructions to acquire imaging data limited to the FOV associated with that particular detection element. In a four channel MRI system, the four most sensitive detection elements may be activated such that data from each detection element is transmitted to a separate data acquisition channel. For example, detection element 104 transmits signals to channel 124, detection element 106 transmits data to channel 126, detection element 108 transmits data to channel 128, and detection element 110 transmits data to channel 130. Each data acquisition channel 124–130 then inputs the received signals to a data processor 132 for subsequent processing and image reconstruction.

Figure 8:
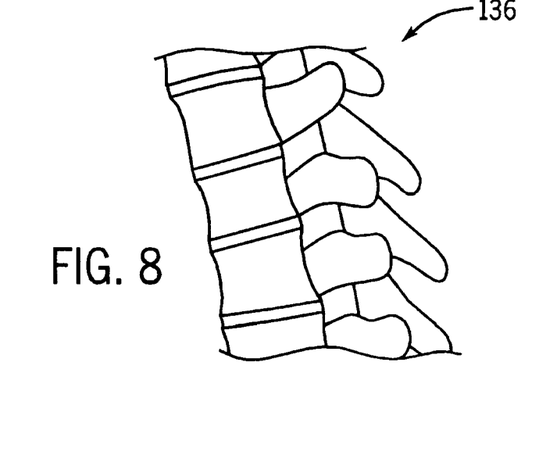
FIG. 8 is a visual representation of a zoom image in accordance with the present invention.

Referring now to FIG. 8, by activating only those detection elements most sensitive to the ROI 135, data may be acquired such that an image 136 with improved resolution may be reconstructed. Image 136 is a visual representation of the data acquired from detection elements 104–110. As illustrated, image 136 has improved resolution and is, in effect, a zoom image of ROI 135 of image 133 of FIG. 6. As heretofore described, data for image 136 is acquired with the same RF coil assembly 90 used to acquire data for image 133 of FIG. 6. That is, by activating only a portion of the detection elements of RF coil assembly 90 data for a zoom image may be acquired without implementation of a separate RF coil assembly. Additionally, a faster image or less noisy image may also be reconstructed.

Figure 9:
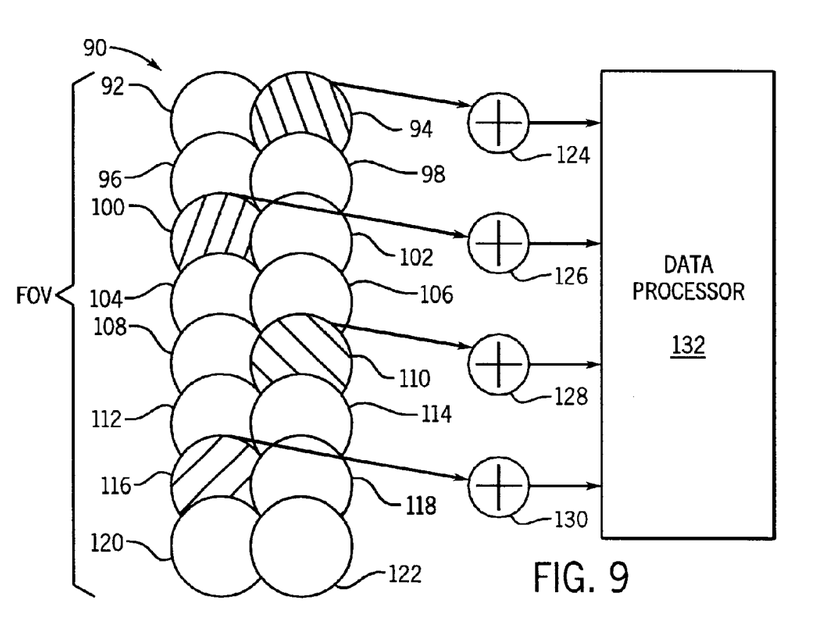
FIG. 9 is a schematic representation of a spinal coil array similar to that shown in FIG. 7 to acquire imaging data for a panoramic image in accordance with the present invention.

Referring now to FIG. 9, another aspect of the present invention is schematically illustrated. Specifically, RF coil assembly 90 is configured such that non-adjacent detection elements may be activated. For example, in the illustrated embodiment, detection elements 94, 100, 110, and 116 are shown as activated to acquire imaging data from a respective portion of the collective FOV. Each activated detection element then transmits data or signals to a dedicated data channel. In this example, detection element 94 transmits data to data channel 124, detection element 100 transmits data to data channel 126, detection element 110 transmits data to data channel 128, and detection element 116 transmits data to data channel 130. This independent activation of detection elements allows for reconstruction of an image of selected portions of the collective FOV.

Figure 10:
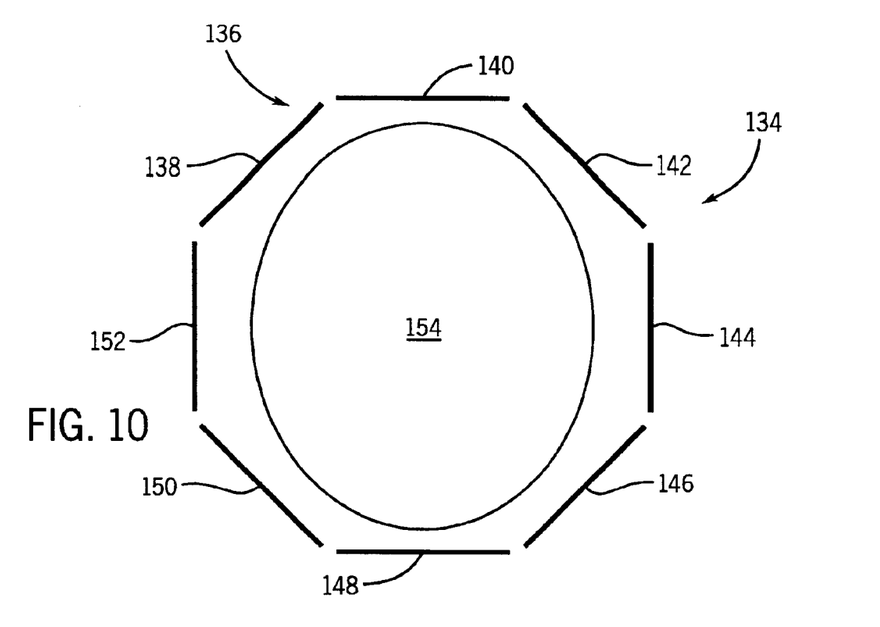
FIG. 10 is a schematic representation of an RF coil array for acquiring imaging data for a volume-of-interest.

Referring now to FIG. 10, a schematic representation of an RF coil array 134 for acquiring imaging data for a VOI is illustrated. Coil array 134, as illustrated, includes an array of detection elements. In this embodiment, array 136 includes eight RF detection elements 138–152. Detection elements 138–152 may be activated to acquire imaging data of a VOI 154 of a patient. Implementation of coil 134 in an MR system having four data acquisition channels enables detection elements 138–152 to be grouped together in a number of sets wherein each set has two detection elements to acquire imaging data corresponding to the entire VOI 154. For example, elements 138 and 140 may be combined into one set wherein the data acquired by each element is transmitted and added together by a single data acquisition channel. Moreover, detection elements 142 and 144 may be grouped into a set, detection elements 146 and 148 maybe grouped into a set, and detection elements 150 and 152 may be grouped into a set. As a result, four sets of detection elements result thereby enabling data acquisition of the VOI. In another embodiment, facing detection elements may be grouped into sets. That is, detection element 138 may be grouped into a single set with detection element 146, detection 140 may be grouped into a single set with element 148, and so forth. Again, four sets of detection elements result.

Because coil 134 is being implemented with a four channel MR system, the detection elements may be grouped into four sets. However, since all data acquisition channels need not be used, some detection elements may not be activated thereby resulting in fewer activated detection elements. Moreover, it is not necessary that each set have the same number of detection elements.

Figure 11:
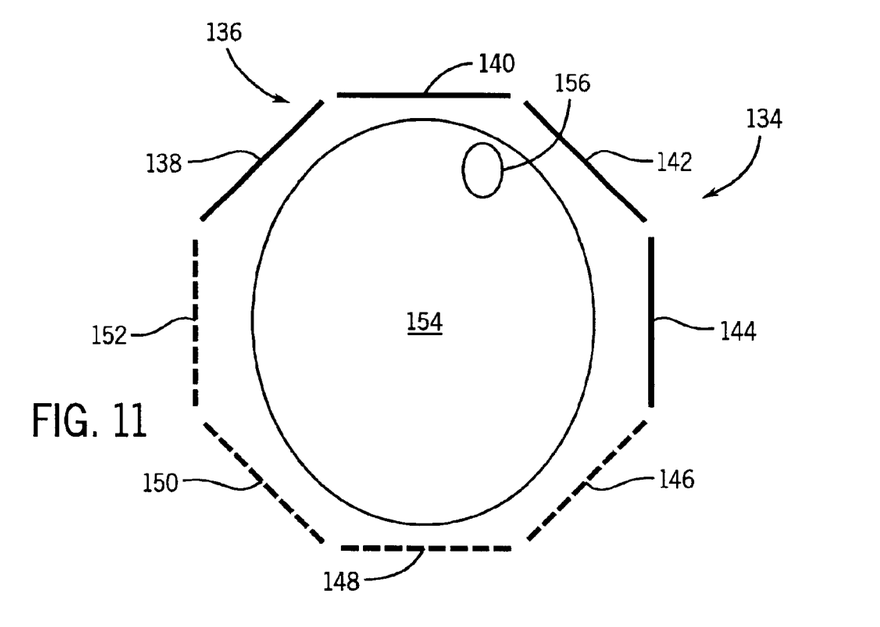
FIG. 11 is a schematic representation of the RF coil array of FIG. 10 to acquire imaging data from a user defined volume-of-interest in accordance with the present invention.

Referring now to FIG. 11, coil 134 is designed such that fewer than all the detection elements may be activated to acquire imaging data corresponding to a VOI 156 smaller than the collective VOI 154 of the entire detection element array 136. For example, detection elements 138–144 may be independently activated to acquire imaging data for the smaller VOI 156. As such, each detection element transmits data to a single and separate data channel. In a four channel MR system, four separate detection elements are activated.

The RF coil assembly heretofore described may dynamically be configured such that the detection elements thereof may be independently activated, or grouped, depending upon the particular imaging needs or clinical objectives of an imaging session. As such, the present invention includes a controller and/or computer responsive to a set of instructions and/or computer program that may dynamically activate/deactivate detection elements of the RF coil assembly to achieve the diagnostic imaging objectives of the imaging session.

Therefore, in accordance with one embodiment of the present invention, an RF coil assembly of an MRI system having plural data acquisition channels is provided. The RF coil assembly includes plurality of detection elements and a control to activate a given number of detection elements from the plurality of detection elements to acquire data of a first ROI, wherein the given number of detection elements exceeds the number of data acquisition channels of the MRI system. The control is further configured to transfer the data from the given number of detection elements across the number of data acquisition channels.

In accordance with yet a further embodiment of the present invention, a method of MR imaging a subject includes the step of positioning the subject to be scanned in an imaging bay of an MR system having an RF coil assembly and a number of data acquisition channels. The RF coil assembly has a plurality of detection elements exceeding the number of data acquisition channels of the MR system. The method further includes the step of activating a specific number of detection elements in an RF coil assembly to acquire imaging data from a first ROI and reconstructing an image of the first ROI. A second ROI within the first ROI is identified from the image of the first ROI and fewer than the specific number of detection elements in the RF coil assembly are activated to acquire imaging data from the second ROI.

In accordance with another embodiment of the present invention, an MRI apparatus includes a plurality of gradient coils positioned about a bore of a magnet to impress a polarizing magnetic field. The apparatus also includes an RF transceiver system and an RF coil assembly to acquire MR images. The RF coil assembly includes a number of detection elements. The MRI apparatus further includes a number of data acquisition channels connected to the number of detection elements wherein the number of detection elements used to acquire imaging data is capable of exceeding the number of data acquisition channels.

In accordance with yet another embodiment of the present invention, a computer readable storage medium having stored thereon a computer program to effectuate image reconstruction is provided. The computer program has a set of instructions that when executed by a computer causes the computer to initiate acquisition of MR data for a first ROI of the subject. The computer is then caused to receive MR data for the first ROI from a number of data acquisition channels of an MRI system. The MR system includes an RF coil assembly having a plurality of RF detection elements wherein the plurality of RF detection elements exceeds the number of data acquisition channels. The computer is then caused to reconstruct an image of the first ROI. A user input identifying a second ROI within the first ROI is received and fewer detection elements than used to acquire MR data of the first ROI are activated so as to acquire MR data of the second ROI using an identical RF coil assembly used to acquire the MR data of the first ROI.

A spinal coil array has heretofore been described, but the present invention is equally applicable to any other coil array. For example, the invention may also be implemented as a single whole body coil such that replacement of RF coil assemblies for different clinical objectives is avoided. For example, a whole body coil having a 128 detection elements could be implemented. The ROI collectively associated with the 128 detection elements corresponds to the maximum ROI of the imaging system. To acquire data for a whole body image, the 128 detection elements may be grouped into a number of sets equal to the number of data acquisition channels of the MR system. For example, for a four channel system, the detection elements are grouped such that each set represents 32 detection elements. To acquire data for smaller ROI, the four sets of detection elements most sensitive to the smaller ROI are activated. For data acquisition limited to an even smaller ROI, the detection elements of the most sensitive set are activated and used to acquired MR data for image reconstruction.

The present invention has been described in terms of the preferred embodiment, and it is recognized that equivalents, alternatives, and modifications, aside from those expressly stated, are possible and within the scope of the appending claims.

What is claimed is:

1. An MRI system having plural data acquisition channels, comprising:
   a plurality of detection elements, each being a single coil detection element arranged from one RF surface coil assembly; and
   a control to activate a given number of detection elements from the plurality of detection elements to acquire data of a first ROI, wherein the given number of detection elements exceeds a number of data acquisition channels in an MRI system, and to transfer the data from the given number of detection elements across the number of data acquisition channels, and to activate fewer detection elements than the given number of detection elements to acquire data of a second ROI, wherein the second ROI is within the first ROI and the control causes each data acquisition channel to receive data from a single detection element when receiving data for the second ROI to acquire data of higher resolution for the second ROI.

2. The RF coil assembly of claim 1 wherein the given number of detection elements is at least three for each active data acquisition channel during acquisition of the data from the first ROI.

3. The RF coil assembly of claim 2 wherein the fewer detection elements to acquire data of the second ROI are positioned non-adjacently to one another to acquire a panoramic view.

4. The RF coil assembly of claim 3 wherein the second ROI is selected based on characteristics of the first ROI.

5. The RF coil assembly of claim 3 wherein the control causes reconstruction of an image of the first ROI and display the first ROI reconstructed image on a display and activate a graphical user interface to allow user placement of a marker box over a region of that displayed using the graphical user interface to define the second ROI.

6. The RF coil assembly of claim 1 wherein the number of detection elements are configured to transfers data across a particular data acquisition channel is independent of the number of detection elements configured to transfer data across another data acquisition channel.

7. The RF coil assembly of claim 1 wherein the control is further configured to combine data from multiple detection elements.

8. The RF coil assembly of claim 1 wherein the control is configured to allow assignment of a given data acquisition channel to more than one detection element, and assignment of another data acquisition channel to a single detection element.

9. The RF coil assembly of claim 1 wherein the control is configured to optimize a discrete number of data acquisition channels to an RF coil assembly with more detection elements than the discrete number of data acquisition channels by combining data from multiple detection elements into a single data acquisition channel.

10. A method of MR imaging a subject comprising the steps of:
    positioning a subject to be scanned in an imaging bay of an MR system having an RF coil assembly and a number of data acquisition channels, the RF coil assembly having a plurality of detection elements that exceed the number of data acquisition channels of the MR system;
    activating a specific number of detection elements in the RF coil assembly to acquire imaging data from a first ROI;
    reconstructing an image of the first ROI;
    identifying a second ROI within the first ROI from the image of the first ROI; and
    using a same RF coil assembly as that used to acquire imaging data from the first ROI, activating fewer than the specific number of detection elements in the RF coil assembly to acquire imaging data from the second ROI.

11. The method of claim 10 further comprising the step of feeding signals from each of the fewer than the specific number of detection elements to a respective data acquisition channel to acquire imaging data from the second ROI.

12. The method of claim 10 further comprising the step of reconstructing an image of the second ROI, wherein the image of the second ROI has a greater resolution than the image of the first ROI.

13. The method of claim 10 wherein the step of activating fewer than the specific number of detection elements includes the step of determining the detection elements most sensitive to the second ROI.

14. The method of claim 13 further comprising the step of determining fewer than the specific number of detection elements from a user input on a GUI displaying the image of the first ROI.

15. The method of claim 13 further comprising the step of determining the second ROI from a user input on a GUI depicting a schematic representation of the plurality of detection elements.

16. An MRI apparatus comprising:
a plurality of gradient coils positioned about a bore of a magnet to impress a polarizing magnetic field;
an RF transceiver system;
an RF coil assembly to acquire MR images, the RF coil assembly, consisting of a number of single coil detection elements; and
a number of data acquisition channels connected to the number of single coil detection elements, wherein the number of single coil detection elements used to acquire imaging data is capable of exceeding the number of data acquisition channels.

17. The MRI apparatus of claim 16 wherein the RF coil assembly is constructed to form a single surface coil and the MRI apparatus further comprises a computer programmed to determine a set of detection elements necessary for data acquisition of a user defined ROI.

18. The MRI apparatus of claim 17 wherein the computer is further programmed to connect each detection element in the set to a given data acquisition channel of the number of data acquisition channels.

19. The MRI apparatus of claim 17 wherein the computer is further programmed to group the number of detection elements into a number of sets equal to the number of data acquisition channels.

20. The MRI apparatus of claim 19 wherein the computer is further programmed to group the number of detection elements such that each set has an equal number of detection elements.

21. A computer readable storage medium having stored thereon a computer program to effectuate image reconstruction and having a set of instructions that when executed by a computer causes the computer to:
initiate acquisition of MR data for a first ROI of a subject;
receive MR data for the first ROI from a number of data acquisition channels of an MR system, the MR system including an RF coil assembly having a plurality of RF detection elements, wherein the plurality of RF detection elements exceeds the number of data acquisition channels;
reconstruct an image of the first ROI;
receive a user input identifying a second ROI within the first ROI; and
activate fewer detection elements than used to acquire MR data of the first ROI so as to acquire MR data of the second ROI using an identical RF coil assembly used to acquire the MR data of the first ROI.

22. The computer readable storage medium of claim 21 wherein the computer is further caused to group the number of RF detection elements activated to acquire the MR data for the first ROI into a number of sets, wherein each RF detection element of each set is configured to transmit acquired signals to a common data acquisition channel.

23. The computer readable storage medium of claim 21 wherein the computer is further caused to activate the RP detection elements most sensitive to the second ROI to acquire the MR data of the second ROI.

24. The computer readable storage medium of claim 23 wherein the computer is further caused to electrically connect each activated RF detection element to a separate data acquisition channel to acquire the MR data of the second ROI.

25. A head coil and control arrangement for MR imaging comprising:
an array of individual detection elements arranged about a periphery and encircling a volume of interest; and
a control connected to an MR system having fewer data acquisition channels than a number of individual detection elements in the array, and connected to each individual detection element in the array, wherein a number of the individual detection elements are grouped and data from each group is transferred to the MR system over a single data acquisition channel, the control operable to activate and receive data from all of the individual detection elements and fewer than all the individual detection elements upon receipt of a user command.

26. The arrangement of claim 25 wherein the MR system has four data acquisition channels and the array has eight individual detection elements.

27. The arrangement of claim 25 wherein adjacent individual detection elements are grouped together.

28. The arrangement of claim 25 wherein oppositely faced individual detection elements are grouped together.

* * * * *

UNITED STATES PATENT AND TRADEMARK OFFICE
CERTIFICATE OF CORRECTION

PATENT NO. : 6,597,173 B1
DATED : July 22, 2003
INVENTOR(S) : Tsur Bernstein

It is certified that error appears in the above-identified patent and that said Letters Patent is hereby corrected as shown below:

Column 10,
Line 10, delete the word "transfers" and substitute therefore -- transfer --;

Column 12,
Line 12, delete "RP" and substitute therefore -- RF --.

Signed and Sealed this

Twenty-first Day of October, 2003

JAMES E. ROGAN
*Director of the United States Patent and Trademark Office*